United States Patent
Ishikawa et al.

(10) Patent No.: US 7,256,489 B2
(45) Date of Patent: Aug. 14, 2007

(54) SEMICONDUCTOR APPARATUS

(75) Inventors: Jun Ishikawa, Aichi-ken (JP); Toshiaki Nagase, Aichi-ken (JP); Hiroyuki Onishi, Aichi-ken (JP); Koichi Akagawa, Aichi-ken (JP)

(73) Assignee: Kabushiki Kaisha Toyota Jidoshokki, Kariya-shi (JP)

( * ) Notice: Subject to any disclaimer, the term of this patent is extended or adjusted under 35 U.S.C. 154(b) by 0 days.

(21) Appl. No.: 10/979,563

(22) Filed: Nov. 2, 2004

(65) Prior Publication Data
US 2005/0093137 A1    May 5, 2005

(30) Foreign Application Priority Data
Nov. 4, 2003 (JP) ............... 2003-374116

(51) Int. Cl.
*H01L 23/48* (2006.01)
(52) U.S. Cl. ............ 257/696; 257/706; 257/707; 257/E23.048; 257/E23.051; 257/150; 257/177
(58) Field of Classification Search ............... None
See application file for complete search history.

(56) References Cited

U.S. PATENT DOCUMENTS

| | | | | |
|---|---|---|---|---|
| 5,466,969 A | * | 11/1995 | Tsunoda | 257/706 |
| 5,559,374 A | * | 9/1996 | Ohta et al. | 257/723 |
| 5,751,058 A | * | 5/1998 | Matsuki | 257/692 |
| 5,917,234 A | * | 6/1999 | Tsuruzono | 257/667 |
| 6,791,167 B2 | * | 9/2004 | Hayashi et al. | 257/667 |
| 2004/0041253 A1 | * | 3/2004 | Yamada et al. | 257/701 |

FOREIGN PATENT DOCUMENTS

| | | |
|---|---|---|
| JP | 02-306640 | 12/1990 |
| JP | 06-275926 | 9/1994 |

OTHER PUBLICATIONS

Notice of Rejection Grounds for Patent Application dated Sep. 2, 2004, issued in Taiwanese counterpart application.
Korean Office Action dated Dec. 12, 2006 for Korean Patent Application No. 2004-88136.

* cited by examiner

*Primary Examiner*—Minhloan Tran
*Assistant Examiner*—Leslie Pilar Cruz
(74) *Attorney, Agent, or Firm*—Morgan & Finnegan, L.L.P.

(57) ABSTRACT

In a semiconductor apparatus in which a main current of a semiconductor device flows through a wiring pattern formed on an insulation circuit board, the rise in temperature of the wiring pattern is suppressed and the increase in cost of parts can be minimized. On the insulation circuit board, a copper pattern is formed. A heat spreader is soldered to the copper pattern, and the heat spreader is loaded with a semiconductor chip. An external electrode and the heat spreader are arranged to shorten the distance between the side of the external electrode and the side of the heat spreader.

3 Claims, 5 Drawing Sheets

SEMICONDUCTOR APPARATUS

BACKGROUND OF THE INVENTION

1. Field of the Invention

The present invention relates to a semiconductor apparatus in which a main current of a semiconductor device flows on the wiring pattern formed on an insulation board.

2. Description of the Related Art

In a semiconductor module in which a plurality of semiconductor devices are enclosed in a case, especially in a power semiconductor module in which a relatively large current flows, it is necessary to reduce the resistance of a wiring pattern between an electrode and an external electrode through which the main current of a semiconductor device flows.

Figure 1:
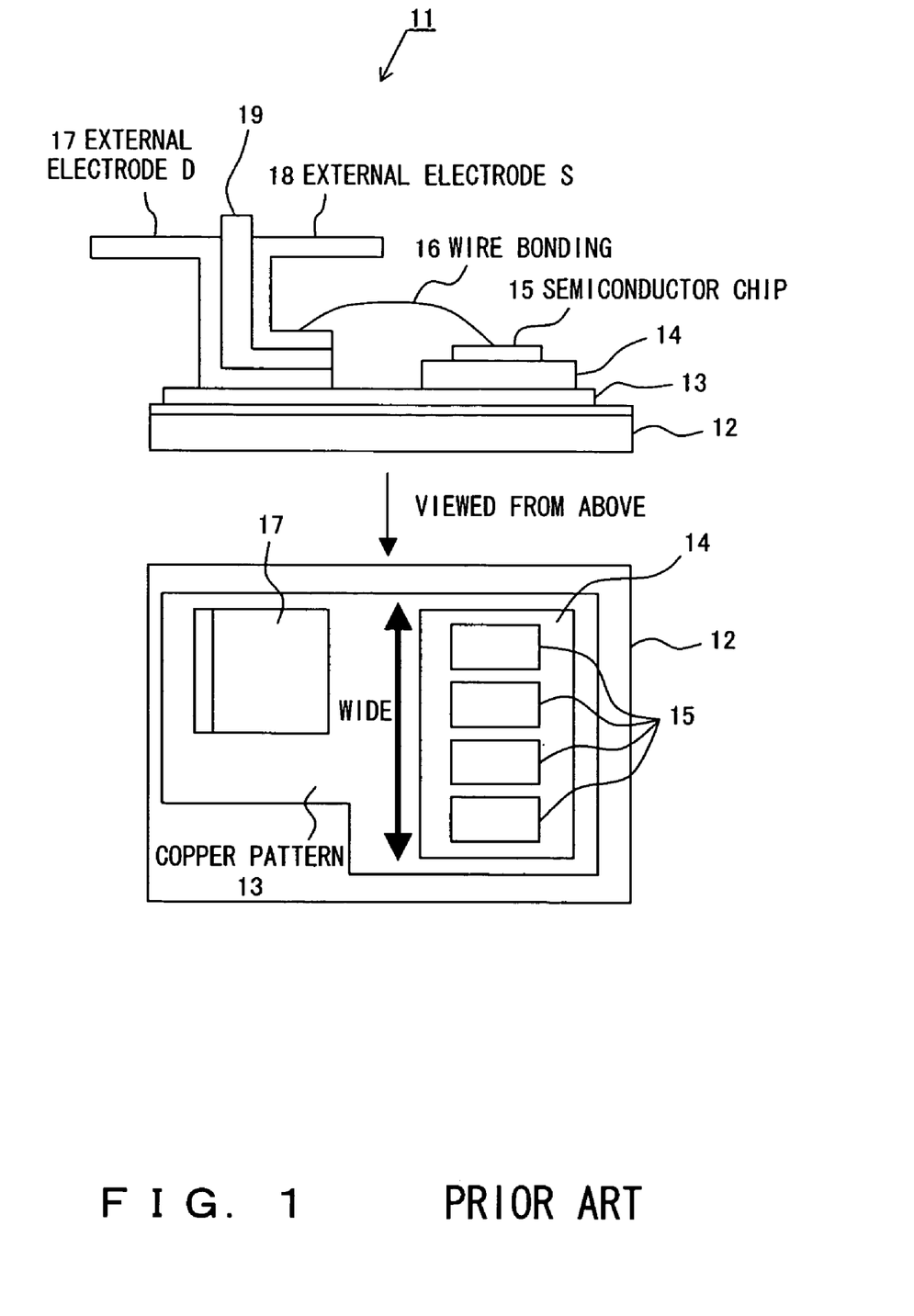
FIG. 1 is a schematic cross-sectional view of a conventional semiconductor module.

For example, in a conventional semiconductor module 11 shown in FIG. 1, a heat spreader 14 is soldered to a copper pattern 13 formed on an insulation circuit board 12, and a semiconductor chip 15 is loaded on to the heat spreader 14. An end of an external electrode 17 is soldered to the copper pattern 13, and the external electrode 17 and an external electrode S 18 are insulated by an insulator 19.

In the semiconductor module 11 shown in FIG. 1, for example, a drain current from the external electrode 17 flows through the copper pattern 13, passes through the heat spreader 14, and enters the drain electrode of the semiconductor chip 15.

When the semiconductor chip 15 is coupled to the external electrode 18 through wire bonding 16, the constraint of the bonding operation can possibly require a predetermined distance between the external electrode 18 and the semiconductor chip 15. Generally, since the copper pattern 13 is thin (for example, about 0.07 mm), the heating value of the copper pattern 13 becomes large due to the current flowing through the copper pattern 13 when the distance between the external electrode 17 and the semiconductor chip 15, that is, the wiring length, becomes longer.

To suppress the heat of the copper pattern 13, the width (vertical length indicated by the arrow shown in FIG. 1) of the copper pattern 13 has been increased to get a larger cross-sectional area as shown in the figure (top perspective view) of the semiconductor module 11 shown in FIG. 1. That is, the width in the direction normal to the direction of the flow of the drain current is increased to obtain a larger cross-sectional area of the current path of the drain current.

Figure 2:
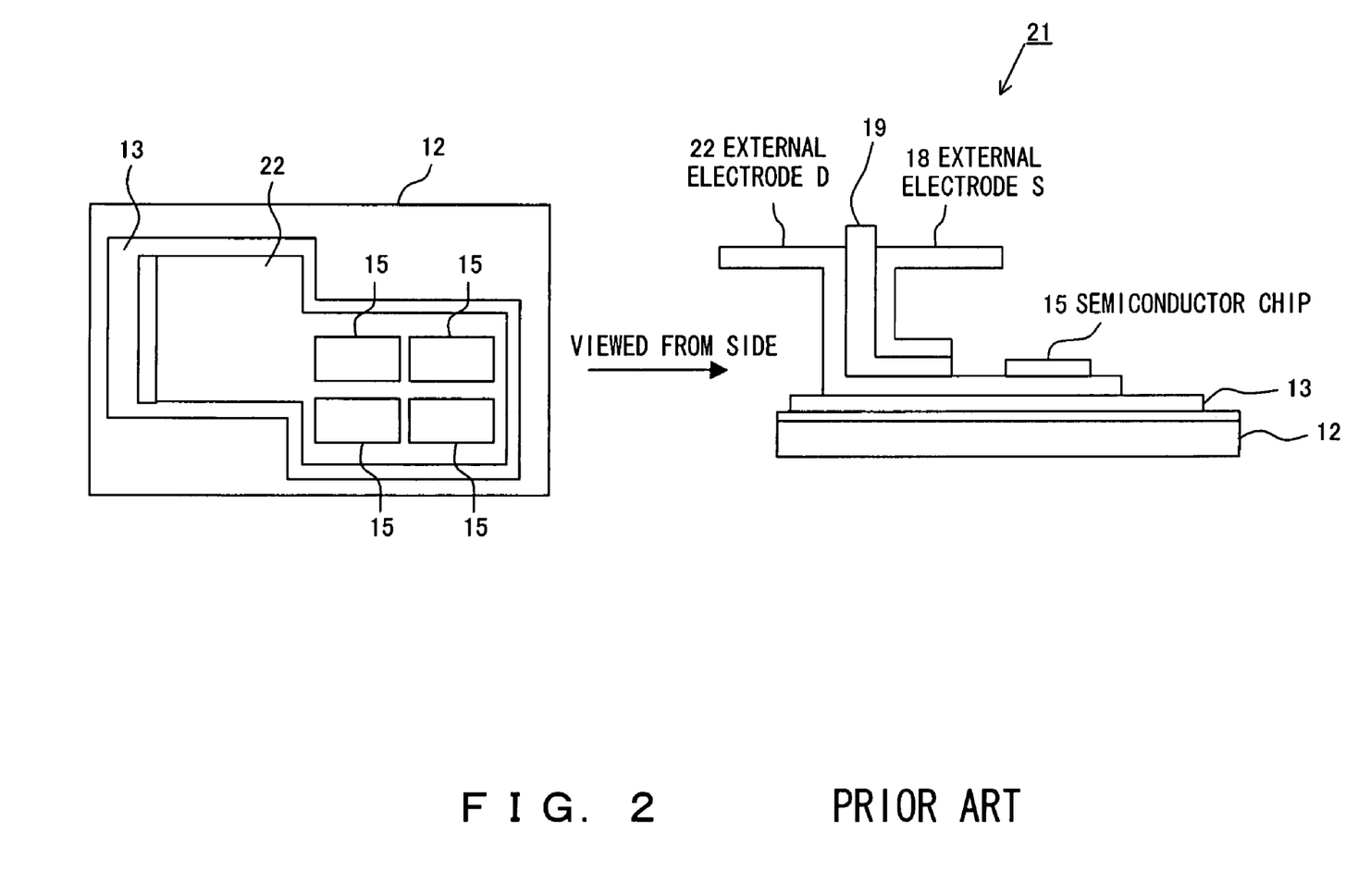
FIG. 2 is a schematic cross-sectional view of a conventional semiconductor module.

FIG. 2 shows the structure of another semiconductor module 21 in which the heat of the copper pattern 13 due to the main current is suppressed.

In the semiconductor module 21, an external electrode 22 is extended to the position below the semiconductor chip 15.

As shown in the right side view in FIG. 2, the dimension of the side opposite the semiconductor chip 15 of the external electrode 22 is longer, and the semiconductor chip 15 is fixed to it by solder, etc.

In this case, the drain current flowing from the external electrode 22 enters the drain electrode of the semiconductor chip 15 from the external electrode 22 below the semiconductor chip 15. Since the external electrode 22 can be thicker than the copper pattern 13, the cross-sectional area of the current path can be increased by the above-mentioned structure, thereby suppressing the heat of the copper pattern 13.

The patent literature 1 discloses the structure of providing a metal frame 2 in which a semiconductor device loaded unit 2a and a main electrode terminal 2b are incorporated into one unit, a semiconductor device 4 is soldered to the semiconductor device loaded unit 2a, and the main electrode terminal 2b is bent and led outside.

The invention described in the patent literature 1 also has the main current flowing through the metal frame 2, thereby also suppressing the heat of the conductor pattern formed on the insulation board.

[Patent Literature 1] Japanese Patent Publication No. Hei 8-17188 (FIG. 1).

However, as shown in FIG. 1, when the cross-sectional area is increased by enlarging the width of the copper pattern 13, there is the problem that the outer dimensions of the semiconductor module 11 are increased.

Furthermore, as shown in FIG. 2, with the structure of loading the semiconductor chip 15 on to the external electrode 22, the width of the copper pattern 13 can be smaller, but it is necessary to increase the outer dimensions of the external electrode 22 formed by copper, etc. so that the entire semiconductor chip 15 can be loaded. As a result, there is the problem that the cost of parts becomes higher.

SUMMARY OF THE INVENTION

The present invention aims at suppressing the rise in temperature of the wiring pattern in which a main current flows, and reducing the cost of parts.

The semiconductor apparatus according to the present invention includes: a semiconductor device; a metal conductor forming an external terminal through which a main current of the semiconductor device flows; and a conductive wiring pattern, formed on an insulation board, for electrically connecting the metal conductor to the semiconductor device. With the configuration, the metal conductor and the semiconductor device are arranged such that the wiring length of the wiring pattern functioning as a current path between the metal conductor and the semiconductor device can be short.

According to the invention, the wiring length of the wiring pattern between the metal conductor and the semiconductor device can be shortened, and the heat of the wiring pattern through which the main current of the semiconductor device flows can be reduced without increasing the outer dimensions of the semiconductor apparatus.

Another semiconductor apparatus according to the present invention includes: a semiconductor device; a metal conductor forming an external terminal through which a main current of the semiconductor device flows; a radiation member loaded with the semiconductor device; and a conductive wiring pattern, formed on a radiation member loaded with the semiconductor device and an insulation board, for electrically connecting the metal conductor to the radiation member. With the configuration, the metal conductor and the radiation member are arranged such that the wiring length of the wiring pattern functioning as the current path between the metal conductor and the radiation member can be short.

According to the invention, the wiring length of the wiring pattern between the radiation member and the metal conductor can be shortened, and the rise in temperature of the wiring pattern through which a main current flows can be reduced without increasing the outer dimensions of the semiconductor apparatus.

According to the above-mentioned invention, the space between the side of the metal conductor and the side of the semiconductor device or the radiation member is filled with a conductive material to reduce the resistance between the metal conductor and the semiconductor device or the radiation member.

With the above-mentioned configuration, the resistance between the metal conductor and the radiation member can be reduced. Thus, since the current flowing through the wiring pattern can be decreased, the rise in temperature can be suppressed and the outer dimensions of the semiconductor apparatus can be reduced.

According to the above-mentioned invention, the conductive material is solder, and a resist is applied to prevent a solder layer from being formed on the top of the sides of the metal conductor and the semiconductor device or the radiation member.

With the above-mentioned configuration, when the space between the metal conductor and the semiconductor device or the radiation member is filled with solder, the solder can be prevented from covering the top of the metal conductor of the radiation member (or the semiconductor device). Thus, the insulation distance between the soldered portion and a portion having different polarity can be reserved.

In the above-mentioned invention, the metal conductor includes: a first metal conductor connected to the semiconductor device by wire bonding; and a second metal conductor electrically connected to the radiation member by the wiring pattern. The end portion of the second metal conductor is protruded farther than the end portion of the first metal conductor toward the semiconductor device, and the distance between the end portion of the second metal conductor and the semiconductor device or the radiation member is shortened.

With the above-mentioned configuration, a predetermined distance can be reserved between the first metal conductor and the semiconductor device for the wire bonding operation, and the distance between the second metal conductor and the semiconductor device or the radiation member can be shortened. Thus, the rise in temperature can be suppressed, and the outer dimensions of the semiconductor apparatus can be reduced.

Figure 3:
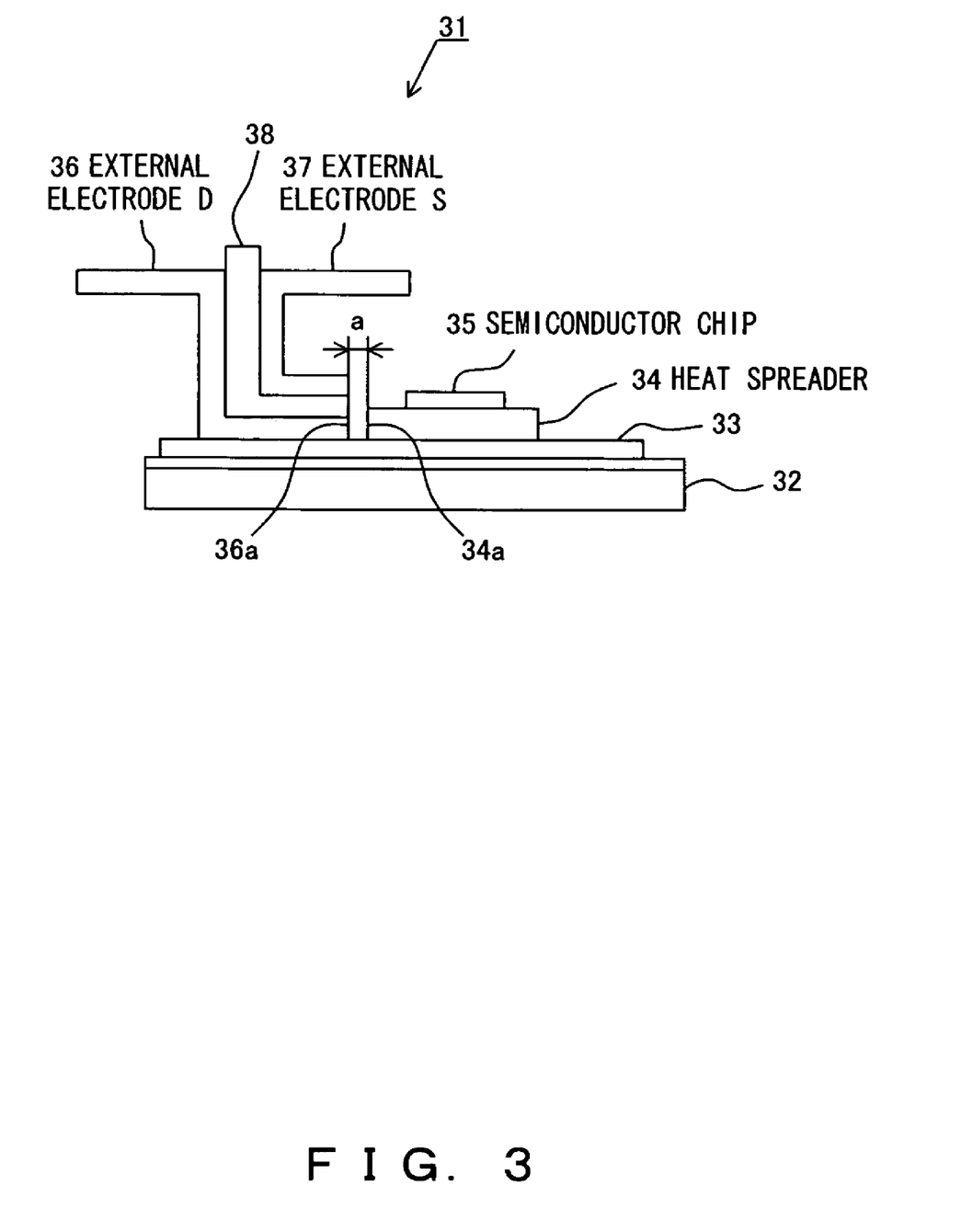
FIG. 3 is a schematic cross-sectional view of a semiconductor module according to the first embodiment of the present invention.

For example, the first metal conductor corresponds to an external electrode 37 shown in FIG. 3, and the second metal conductor corresponds to an external electrode 52 shown in FIG. 3.

DETAILED EXPLANATION OF THE PREFERRED EMBODIMENTS

The embodiments of the present invention are explained below by referring to the attached drawings. FIG. 3 is a schematic sectional view of a power semiconductor module (semiconductor apparatus) 31.

On an insulation circuit board 32, a copper pattern (conductive wiring pattern) 33 is formed. A heat spreader (radiation member) 34 is soldered to the copper pattern 33. A semiconductor chip (semiconductor device) 35 is loaded on to the heat spreader 34, and the drain electrode of the semiconductor chip 35 is electrically connected to the heat spreader 34. The heat spreader 34 is provided for the radiation of the semiconductor chip 35.

One end of an external electrode D (metal conductor or a metal wiring conductor) 36 is soldered to the copper pattern 33, and the other end is led outside the case (not shown in the attached drawings) of the power semiconductor module (hereinafter referred to as a semiconductor module) 31 to form an external terminal. One end of an external electrode 37 is connected to the source electrode of the semiconductor chip 35 by wire bonding, and the other end is led outside the case to form an external terminal. The external electrode 36 and the external electrode 37 are inserted into the resin, and are insulated by an insulator 38.

A resin case is covered on the insulation circuit board 32 loaded with the semiconductor chip 35, and the case is adhered to the insulation circuit board 32 to form the semiconductor module 31.

In the above-mentioned first embodiment, the external electrode 36 and the heat spreader 34 are arranged such that the distance a (distance a in the horizontal direction shown in FIG. 3) between a side 36a of the external electrode 36 and a side 34a of the heat spreader 34 can be short when, for example, there is a small constraint by an operation such as wire bonding, etc.

With the above-mentioned arrangement, the wiring length (distance a) of the copper pattern 33 between the external electrode 36 and the heat spreader 34 is short. Therefore, the resistance of the copper pattern 33 between the external electrode 36 and the heat spreader 34 can be small. Thus, the rise in temperature of the copper pattern 33 when a drain current flows can be suppressed. Furthermore, by shortening the wiring length of the copper pattern 33 between the external electrode 36 and the heat spreader 34, it is not necessary to increase the width (length in the direction normal to the direction of the drain current) of the copper pattern 33, thereby reducing the outer dimensions of the semiconductor module 31.

Figure 4:
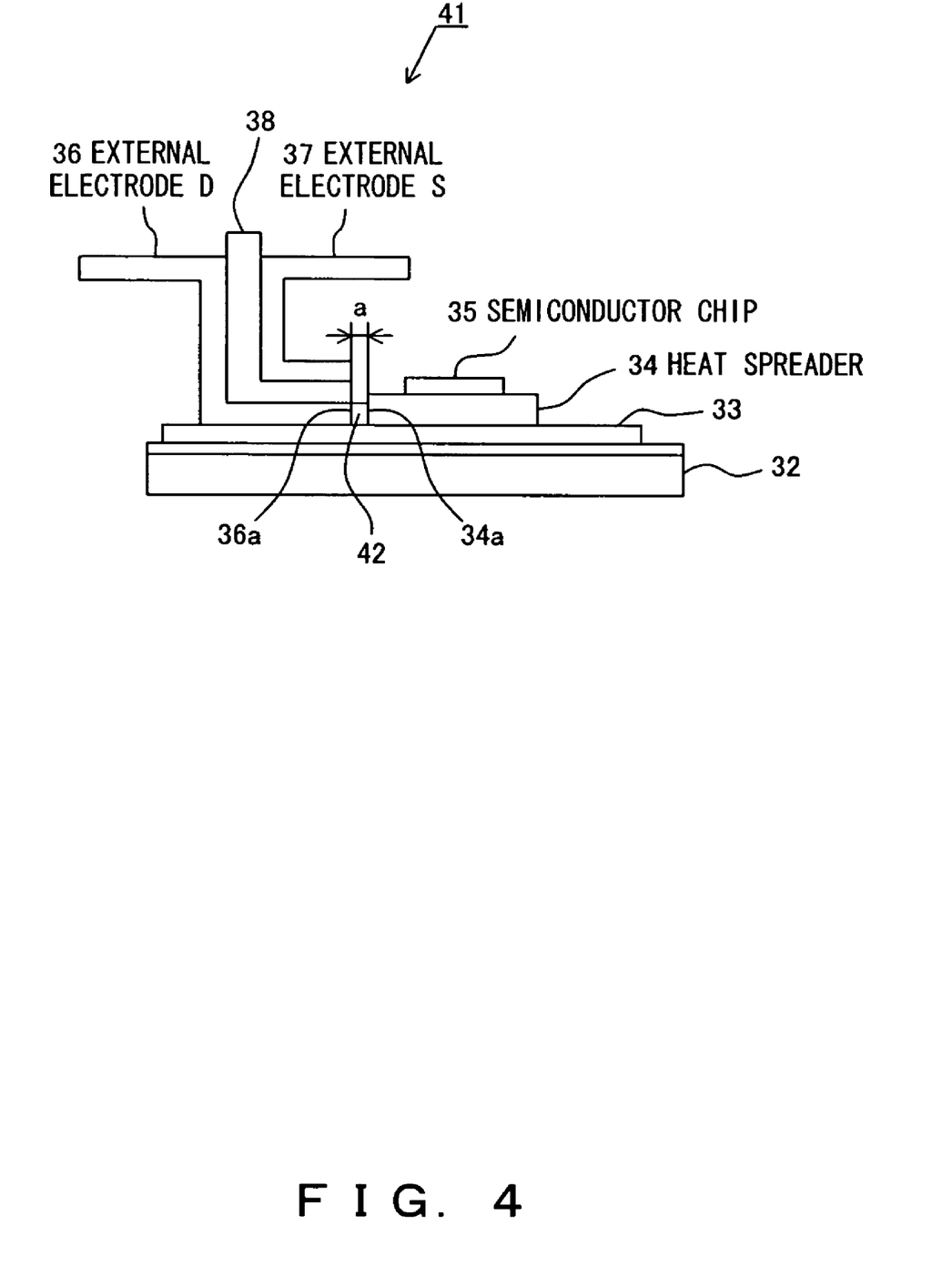
FIG. 4 is a schematic cross-sectional view of a semiconductor module according to the second embodiment of the present invention.

FIG. 4 is a schematic cross-sectional view of a semiconductor module 41 according to the second embodiment of the present invention. In FIG. 4, the same unit shown in FIG. 3 is assigned the same reference numeral, and the explanation is omitted here.

In the second embodiment, the space between the side 36a of the external electrode 36 and the side 34a of the heat spreader 34 is filled with solder (conductive material) 42 to reduce the resistance between the external electrode 36 and the heat spreader 34.

In the semiconductor module 41 with the above-mentioned structure, the drain current entering from the external electrode 36 flows into the heat spreader 34 through the copper pattern 33 and the solder 42. At this time, the thickness (dimension in the vertical direction shown in FIG. 4)) of the solder 42 is larger than that of the copper pattern 33. Therefore, most of the drain current passes through the solder 42 to the heat spreader 34. Furthermore, it enters the drain electrode of the semiconductor chip 35 through the heat spreader 34. Thus, the drain current flowing through the copper pattern 33 between the external electrode 36 and the heat spreader 34 decreases, thereby suppressing the rise in temperature of the copper pattern 33.

According to the second embodiment, the space between the external electrode 36 and the heat spreader 34 is filled with the solder 42 to increase the cross-sectional area of the current path of the drain current flowing from the external electrode 36 to the heat spreader 34. Thus, the current which flows through the portion of the solder 42 can be increased, and the current which flows through the copper pattern 33 between the external electrode 36 and the heat spreader 34 can be reduced. As a result, the rise in temperature of the copper pattern 33 can be suppressed. Also, by shortening the wiring length of the copper pattern 33 between the external electrode 36 and the heat spreader 34, it is not necessary to increase the width (length in the direction normal to the flow direction of the drain current) of the copper pattern 33, thereby decreasing the outer dimensions of the semiconductor module 41.

When the space between the external electrode 36 and the heat spreader 34 is filled with the solder 42, metal plating is applied to the side 36a of the external electrode 36 and the side 34a of the heat spreader 34, and a solder resist can be applied to the top of either side.

As described above, by applying a resist to the top of the side, the solder 42 can be prevented from reaching upper portion of the external electrode 37 or the top of the heat spreader 34 when the space between the external electrode 36 and the heat spreader 34 is filled with the solder.

Figure 5:
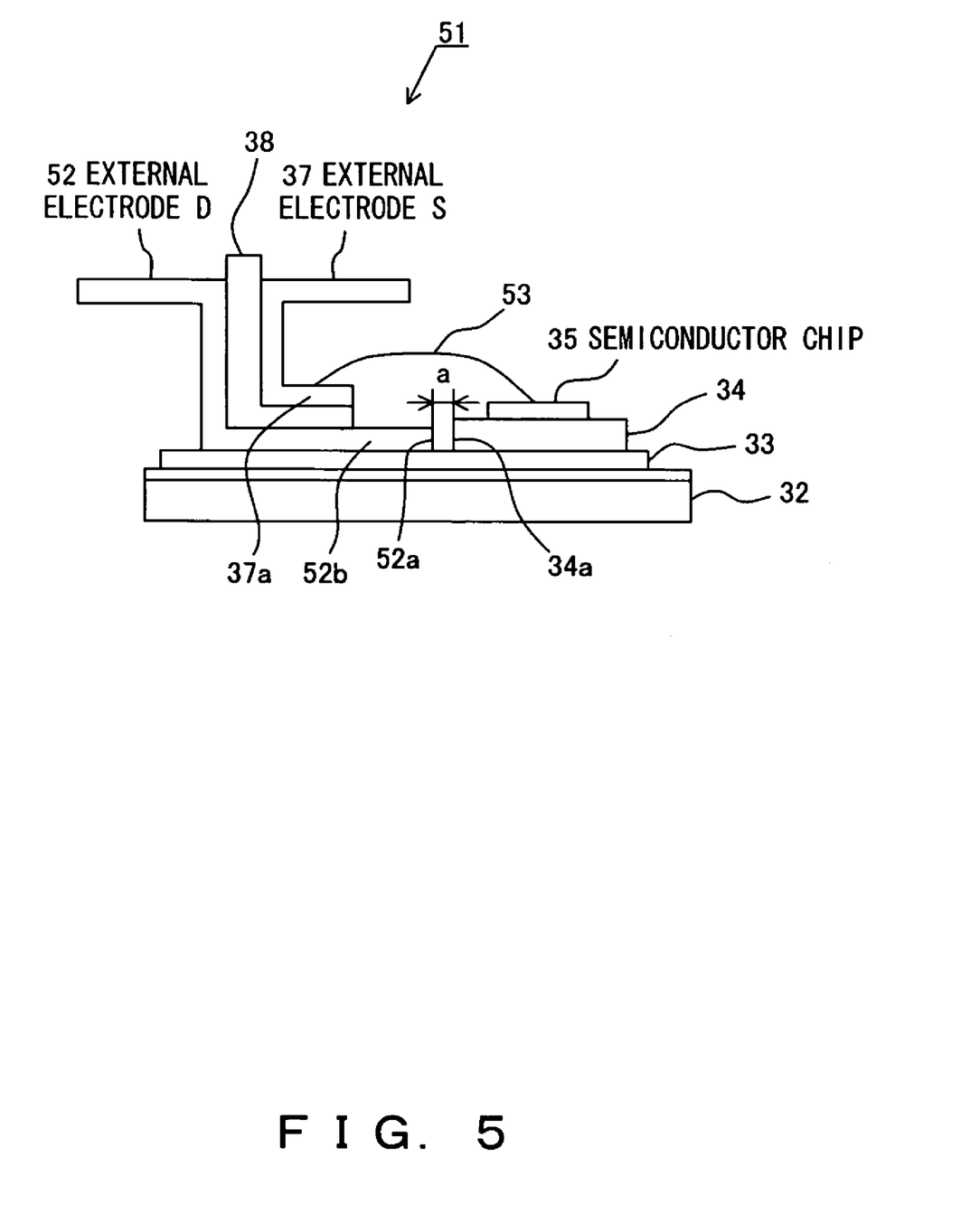
FIG. 5 is a schematic cross-sectional view of a semiconductor module according to the third embodiment of the present invention.

FIG. 5 is a schematic cross-sectional view of a semiconductor module 51 according to the third embodiment of the present invention. In FIG. 5, the same unit shown in FIG. 3 is assigned the same reference numeral, and the explanation is omitted here.

In the third embodiment, an end portion 52b of the external electrode 52 is protruded toward the heat spreader 34 to shorten the distance a between the side 52a of the external electrode 52 and the side 34a of the heat spreader 34.

As shown in FIG. 5, the tip of the end portion 52b of the external electrode 52 is protruded farther than the tip of an end portion 37a of the external electrode 37 toward the semiconductor chip 35 (to the right in the horizontal direction as viewed from the front shown in FIG. 5).

With the structure, a predetermined distance is reserved between the end portion 37a of the external electrode 37 and the end portion of the semiconductor chip 35 where wire bonding 53 is performed, thereby shortening the distance a between the side 52a of the external electrode 52 and the side 34a of the heat spreader 34.

In the third embodiment, the dimension in the horizontal direction of the end portion 52b of the lower external electrode 52 is increased, and the dimension of the upper 37 is shorter. Therefore, the distance between the external electrode 37 and the semiconductor chip 15 can be sufficiently reserved when the wire bonding 53 is performed between the semiconductor chip 35 and the end portion 37a of the upper external electrode 37. Thus, although it is necessary to keep a predetermined distance or longer between them under a constraint of the bonding operation, the distance between the external electrode 52 and the heat spreader 34 through which a drain current flows can be shortened.

According to the third embodiment, a predetermined distance can be reserved between the external electrode 37 and the semiconductor chip 35, and the distance between the external electrode 52 and the heat spreader 34 in which a main current flows can be shortened. Thus, the resistance of the copper pattern 33 between the external electrode 37 and the heat spreader 34 can be reduced, and the rise in temperature of the copper pattern 33 can be suppressed. The distance between the external electrode 36 and the heat spreader 34 can also be shortened, and it is not necessary to increase the width (length in the direction normal to the flow direction of a current) of the copper pattern 33, the outer dimensions of the semiconductor module 41 can be reduced.

In the third embodiment, the solder 42 can fill the space between the external electrode 52 and the heat spreader 34.

With the above-mentioned configuration, the cross-sectional area of the current path between the external electrode 52 and the heat spreader 34 can be increased, thereby further reducing the resistance.

The present invention is not limited to the above-mentioned embodiments, but can also be configured as follows.

In the first through third embodiments, the heat spreader 34 is provided for the radiation of the semiconductor chip 35. It can be replaced with the semiconductor chip 35 directly soldered onto the copper pattern 33. In this case, the distance between the side of the semiconductor chip 35 and the side of the external electrode 36 or 52 is to be shortened.

In the second embodiment, the material for filling the space between the 36 and the heat spreader 34 is not limited to the solder 42, but any conductive material for connecting with low resistance between the external electrode 36 of copper and the heat spreader 34 or semiconductor chip 35 can be applied.

Furthermore, the resist to be applied to the sides of the external electrode 36 and the heat spreader 34 is not limited to a solder resist, but any resist can be applied depending on an available conductive material.

According to the present invention, the wiring length of the wiring pattern between a metal conductor and a semiconductor device or a radiation member can be shortened. Therefore, the rise in temperature of the wiring pattern can be suppressed, and the outer dimensions of the semiconductor apparatus can be reduced. Additionally, by filling the space between the metal conductor and the semiconductor device or the radiation member with a conductive material, the resistance between the metal conductor and the semiconductor device or the radiation member can be reduced, the rise in temperature of the wiring pattern can be suppressed, and the outer dimensions of the semiconductor apparatus can be decreased.

What is claimed is:

1. A semiconductor apparatus, comprising:
    an insulation board;
    a conductive wiring pattern, formed on the insulation board, for electrically connecting device units formed thereon;
    a radiation member formed on a first portion of the conductive wiring pattern;
    a semiconductor device formed on the radiation member; and
    a metal conductor formed on a second portion of the conductive wiring pattern separated from the first portion thereby forming a space between the edge of the radiation member and the edge of the metal conductor,
    wherein a conductive material is disposed between the radiation member and the metal conductor, thereby reducing resistance of the conductive wiring pattern between the radiation member and the metal conductor, and
    wherein said conductive material is solder.

2. A semiconductor apparatus, comprising:

an insulation board;

a conductive wiring pattern, formed on the insulation board, for electrically connecting device units formed thereon;

a radiation member formed on a first portion of the conductive wiring pattern;

a semiconductor device formed on the radiation member;

a first metal conductor formed on a second portion of the conductive wiring pattern separated from the first portion thereby forming a space between the edge of the radiation member and the edge of the metal conductor; and a second metal conductor formed on the first metal conductor via an insulation layer, wherein the first metal conductor is protruded toward the space beyond the boundary of the second metal conductor and, thereby reducing resistance of the conductive wiring pattern between the radiation member and the first metal conductor.

3. The apparatus according to claim 2, wherein:

the second metal conductor is connected to said semiconductor device by wire bonding; and the first metal conductor is electrically connected to said radiation member by the conductive wiring pattern.

* * * * *

UNITED STATES PATENT AND TRADEMARK OFFICE
CERTIFICATE OF CORRECTION

PATENT NO. : 7,256,489 B2  Page 1 of 1
APPLICATION NO. : 10/979563
DATED : August 14, 2007
INVENTOR(S) : Jun Ishikawa et al.

It is certified that error appears in the above-identified patent and that said Letters Patent is hereby corrected as shown below:

Column 5, line 25, please delete "from reaching upper" and insert therefore -- from reaching the upper --;

Column 5, line 52, please delete "of the upper 37" and insert therefore -- of the upper external electrode 37 --;

Column 5, line 54, please delete "semiconductor chip 15" and insert therefore -- semiconductor chip 35 --; and Column 6, line 24, please delete "space between the 36" and insert therefore -- space between the external electrode 36 --.

Signed and Sealed this

Eighteenth Day of August, 2009

David J. Kappos
*Director of the United States Patent and Trademark Office*